United States Patent [19]

Tidman

[11] Patent Number: 4,897,558
[45] Date of Patent: Jan. 30, 1990

[54] SUPERCONDUCTING DEVICE, APPARATUS AND METHOD FOR SELECTIVELY SUPPLYING CURRENT TO A LOAD

[75] Inventor: Derek A. Tidman, Silver Spring, Md.

[73] Assignee: GT-Devices, Alexandria, Va.

[21] Appl. No.: 127,927

[22] Filed: Dec. 1, 1987

[51] Int. Cl.$^4$ ............................................ H03K 17/92
[52] U.S. Cl. .................................. 307/245; 307/306; 357/5; 505/860
[58] Field of Search ...................... 307/245, 306, 277; 357/5; 505/860, 862

[56] References Cited

U.S. PATENT DOCUMENTS

| | | | |
|---|---|---|---|
| 2,913,881 | 11/1959 | Garwin | 307/245 |
| 3,173,079 | 3/1965 | McFee | 307/306 |
| 3,271,592 | 9/1966 | Bremer et al. | 307/245 |
| 3,720,847 | 3/1973 | Massar | 307/306 |

OTHER PUBLICATIONS

"Progress Toward A superconducting Opening Switch", D. R. Humphreys, Sixth IEEE Pulse Power Conference Abstracts, (Jun./Jul. 1987).

Primary Examiner—John Zazworsky
Attorney, Agent, or Firm—Lowe, Price, Leblanc, Becker & Shur

[57] ABSTRACT

A load is selectively supplied with current from an energy storing inductor shunted by a superconducting device. In the normal and superconducting states, the superconducting device respectively has an impedance greater than and much less than that of the load. Circulating current from the inductor flows through the device while it is in a superconducting state. The load is connected to the inductor and superconducting device so that when the device is in the normal state circulating current in the inductor is swtiched to flow from the device through the load. A solenoid wound on the superconducting structure responds to a current source to induce an axial magnetic field in the structure. The axial magnetic field induces in the structure an azimuthal current having sufficient density to change the device from the superconducting to the normal state.

36 Claims, 2 Drawing Sheets

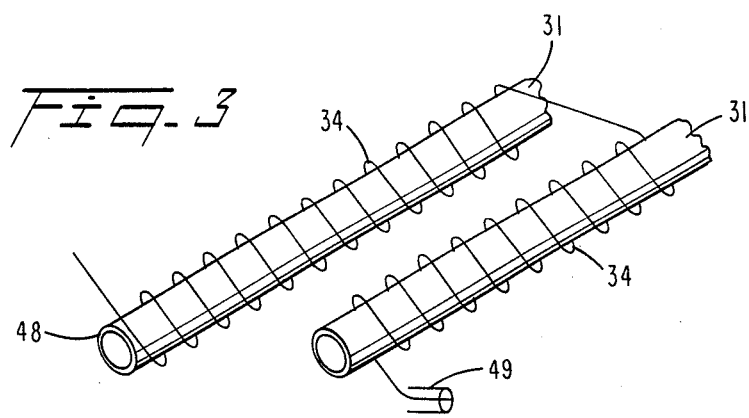
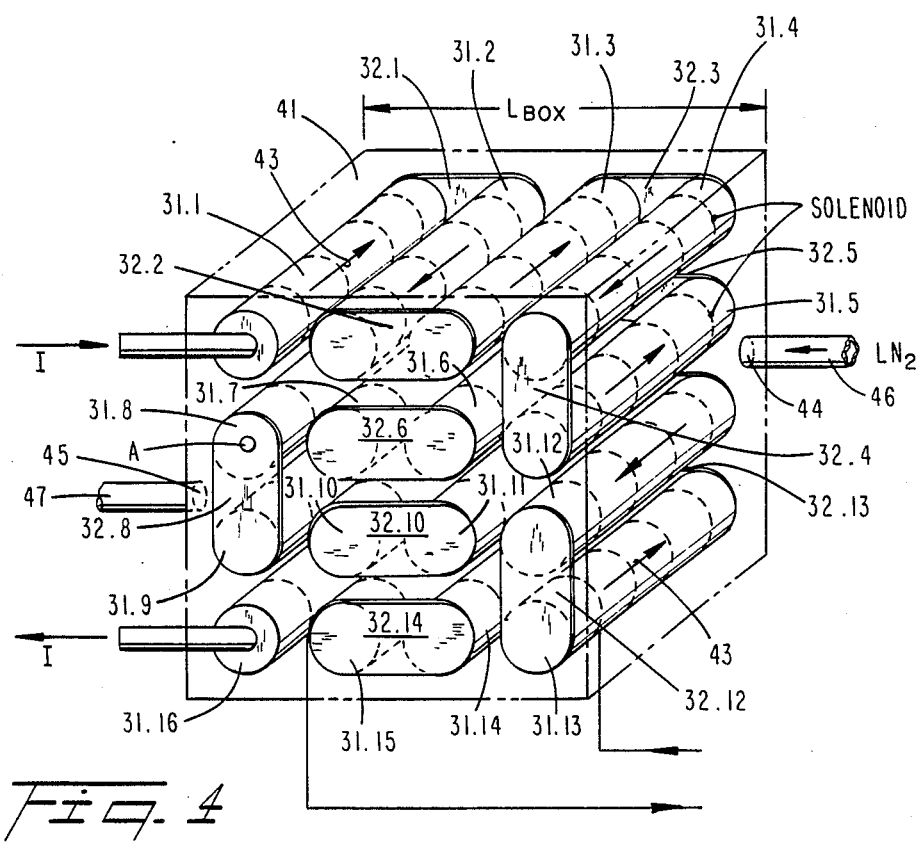

SUPERCONDUCTING DEVICE, APPARATUS AND METHOD FOR SELECTIVELY SUPPLYING CURRENT TO A LOAD

FIELD OF INVENTION

The present invention relates generally to superconducting devices, to circuits including same and to methods for operating the circuits. In accordance with one particular aspect of the invention, a solenoid wound on a superconducting structure induces in the structure an axial magnetic field, that induces in the structure an azimuthal current having sufficient density to change the structure from a superconducting state to a normal state. In accordance with a further aspect of the invention, a superconducting device connected in shunt with an energy storing inductor is switched between the superconducting and normal states to control the application of current from the inductor to the load.

BACKGROUND ART

In U.S. Pat. No. 4,670,662, commonly assigned with the present invention, energy storing inductors are employed to selectively supply current to a load. While each inductor is storing energy, it is short circuited, so a recirculating current flows through the inductor and short circuit. The magnitude of the recirculating current remains essentially constant, if the resistive impedance of the inductor and the impedance of the short circuit are sufficiently small. When it is desired to apply the recirculating current to a load, the short circuit is removed. It is desirable to remove the short circuit as fast as possible, preferably in less than a fraction of a millisecond, to minimize losses and maximize efficiency. A problem with the prior art device is that the switches have not, in many cases, been capable of handling large amounts of current with high operating speed and the short circuit impedance has been excessive.

THE INVENTION

In accordance with one aspect of the invention, current is selectively applied by an energy storing inductor to a load by activating a superconducting device connected in shunt with the inductor between the normal and superconducting states. The superconducting device, when in the normal state, has an impedance much greater than that of the load. In the superconducting state, the superconducting device has an impedance much less than that of the load, causing circulating current from the inductor to flow through the device. The load is connected to the inductor so that when the device is in the normal state circulating current in the inductor is switched to flow from the superconducting device through the load.

Because the device has negligible impedance while activated in the superconducting state, there is a constant circulating current flowing between the inductor and load, with virtually no energy dissipation. The superconducting device can, in accordance with the preferred embodiment of the invention, be switched at very high speed, on the order of tens of microseconds, between the superconducting and normal states.

In the preferred embodiment, the superconducting device is switched between the superconducting and normal states in response to an axial magnetic field being applied to the superconducting structure. A solenoid connected to a current source induces the axial magnetic field in the superconducting structure. The axial magnetic field induces in the structure an azimuthal current having sufficient density to change the state of the superconducting device from the superconducting state to the normal state.

In the preferred embodiment, the solenoid is driven by an energy storing capacitor. The capacitance of the capacitor and inductance of the solenoid have values and are connected with each so that a damped sinusoidal current flows in the solenoid. The damped sinusoidal current has a sufficiently large slope during the first quarter cycle thereof to cause the azimuthal current induced in the structure (proportional to the slope of the magnetic field supplied to the structure in response to the solenoid current) to have a density exceeding a critical value that causes the device to change from the superconducting state to the normal state. The superconductor is disconnected from the storage inductor during the first quarter cycle of the solenoid sinusoidal current, while the superconductor is in the normal state, prior to the maximum value of the solenoid current being reached at 90°; at 90° the magnetic field change supplied to the superconductor structure is zero because the slope of the solenoid current is zero. By cutting off the superconductor current as stated the superconducting structure does not oscillate between the normal and superconducting states in response to oscillation of the solenoid current. Selection of the capacitance value and proper design of the solenoid fixes the frequency of the damped sinusoid to provide high speed switching between the superconducting and normal states of the device.

The superconducting device of the present invention can be operated at a temperature considerably below the critical temperature thereof, i.e., the temperature which the superconducting material switches from the superconducting to the normal state. This is because switching from the superconducting state to the normal state is in response to magnetic field changes ( $dB/dt$, where $B$=magnetic flux density) that induce azimuthal eddy currents in the superconducting material. Use of $dB/dt$ to control the state of the superconductor, instead of the quasi-static critical magnetic field ($B_c$), is advantageous because $B_c$ is usually large, therefore requiring a large magnetic structure and high current. Because the superconducting device can be operated at temperatures considerably below the critical temperature, very large currents can flow through the device while it is in the superconducting state, without tripping the device into the normal state.

Another advantage of the present invention is that after the energy stored in the inductor has been transferred to the load, the superconducting device is in a superconducting state, ready for immediate reuse. The device is heated only by a negligible amount by the energy transferred to it from the energy storing capacitor via the solenoid and the damped sinusoid.

It is, accordingly, an object of the present invention to provide a new and improved superconducting structure capable of being switched at high speed from a superconducting to a normal state.

Another object of the invention is provide a new and improved switching device and method, particularly adapted for selectively switching a circulating current of a charged storage inductor to a load.

A further object of the invention is to provide a new and improved superconducting device utilized in a system for switching a circulating current from a charged storage inductor to a load.

A further object of the invention is to provide a method of and apparatus for activating a superconducting device from a superconducting state to a normal state to supply circulating current from a charged inductor to a load.

Metal superconductors have previously been proposed as switching devices. However, the switch is opened and closed depending upon whether the superconducting material is in a superconducting state or in a normal state. However, the prior art devices are not suitable for switching a circulating current of a charged inductor to a load. Typically, the prior art superconducting switch devices, when in the normal state, have relatively low resistances, commensurate with those of metal conductors. When the prior art superconducting switches are in the normal state, the impedance thereof is considerably less than that of many loads, to prevent switching of the circulating current from the charged inductor to the load. In the present invention, ceramic superconductors are employed. These superconductors, while in the normal state, typically have a resistivity several orders of magnitude larger than copper.

Hence, the normal state impedance of the ceramic superconductor structure can readily be made much greater (at least five times) than that of the load. The ceramic superconductors, when in the superconducting state, have virtually zero impedance. Thereby, the ceramic superconducting device connected across the charged inductor does not dissipate any energy from the inductor, so that the circulating current is maintained at a substantially constant level, particularly if the inductor has very low internal resistance. Because the impedance of the ceramic superconductor structure, when activated to the normal state, is much greater than that of the load, the circulating current is switched from the superconducting device to the load in response to the device being switched from the superconducting to the normal state. Switching of the circulating current into the load occurs at very high speed, without an arc, because the solenoid is wound on the superconductor structure and connected to a charged capacitor source.

The above and still further objects, features and advantages of the present invention will become apparent upon consideration of the following detailed description of several specific embodiments thereof, especially when taken in conjunction with the accompanying drawing.

BRIEF DESCRIPTION OF THE DRAWING

FIG. 3 is an enlarged view of a portion of the superconducting structure illustrated in FIGS. 1 and 2; and FIG. 4 is a perspective view of a preferred embodiment of the superconducting switch device illustrated in FIGS. 1 and 2.

DESCRIPTION OF THE PREFERRED EMBODIMENT

Figure 1:
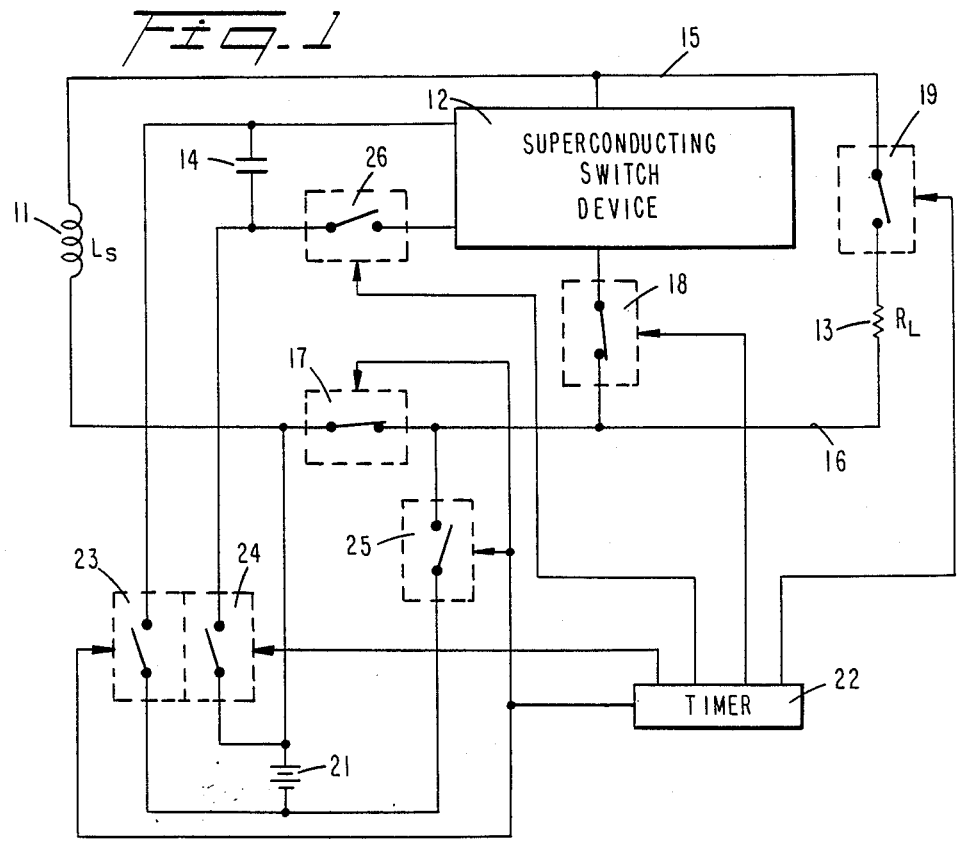
FIG. 1 is a circuit diagram of an apparatus in accordance with one aspect of the present invention for controlling the current flowing to a load with a superconducting switching device.

Reference is now made to FIG. 1 of the drawing wherein energy storing inductor 11 is illustrated as being selectively connected to superconducting switch device 12 and load 13, illustrated, for example, as a load resistor. Superconducting device 12, preferably utilizing ceramic superconductor, is capable of being switched between a superconducting state having virtually zero impedance, and a high impedance state, wherein the impedance of device 12 is at least five times greater than that of load 13. Superconducting device 12 thus has two resistance states:

R=O (superconducting state) and $$R = 0 \text{ (superconducting state) and}$$

$$R_N = \frac{r_n d}{A_d} \text{ (normal state)}$$

where:

d = total path length of current flowing through the superconducting structure in device 12, $r_n$ = resistivity of device 12 to the current flowing through path length d while the device is in the normal state (typically $r_n$ is several orders of magnitude greater than the resistivity of copper), and $A_d$ = cross-sectional area for current flowing through path length d.

In the preferred embodiment, superconducting device 12 is at liquid nitrogen temperature so it is normally in the superconducting state and is switched to the normal state in response to current supplied to the device by capacitor 14.

An example of the superconductor material in device 12 is $YBa_2Cu_3O_{6.9}$, prepared as a pressed and sintered crystaline power by repeated grindings and high temperature bakings until it has mainly a single crystalline phase. Solid conductor forms can be prepared by pressing and sintering for several hours. By the use of substitutional chemistry (e.g., replacement of Y with Eu) other superconductor materials can be prepared.

Opposite terminals of inductor 11 are connected to device 12 and load 13 by leads 15 and 16, normally closed switches 17 and 18 and by normally open switch 19. Switch 17 is connected between one terminal of inductor 11 and lead 16, while switch 18 is connected between lead 16 and one terminal of superconducting device 12. Switch 19 is connected between lead 15 and load 13.

With switches 17 and 18 in the normally closed states thereof and superconducting device 12 being in the superconducting state, charged inductor 11 is connected with device 12 causing a circulating current which may be in the many kiloamperes range to flow exclusively from the inductor through the superconducting device. The level of the circulating current is maintained relatively constant because device 12 has virtual zero impedance.

In response to device 12 being activated into the high impedance normal state, as occurs in response to current flowing to the device from capacitor 14, most (at least 80%) of the circulating current from inductor 11 is rapidly and arclessly switched from device 12 to load 13 since switch 19 is closed immediately prior to device 12 being activated into the normal state. The arcless transfer of current from device 12 to load 13 occurs because (1) there is merely a change of impedance value of device 12 and (2) switches 17, 18 and 19 are all closed at the time device 12 is switched from the superconducting to the normal state.

To control charging of inductor 11 and capacitor 14 as well as opening and closing of switches 17, 18 and 19, DC source 21, timer 22 and switches 23–26 are provided. Timer 22 controls the opening and closing of switches 17–19 and 23–26. DC source 21 can be any suitable DC source, such as a battery pack or a rotating DC machine such as a compulsator.

Inductor 11 is initially charged by current from DC source 21 in response to timer 22 activating switches 17, 18, 19 and 25 so they are respectively in the open, closed, open and closed states. With switches 17–19 and 25 in the stated initial conditions and superconducting switch device 12 at the temperature of liquid nitrogen, the device is in the superconducting state. Under the stated conditions, current flows from one electrode of DC source 21 through inductor 11, superconducting switch device 12 and switches 18 and 25 to the other electrode of source 21. After inductor 11 has been thereby charged over a relatively long interval until a large current is flowing from DC source 21 to inductor 11 and superconducting switch device 12, switch 17 is closed and then switch 25 is opened. Closure of switch 17 and opening of switch 25 removes DC source 21 from the circuit, leaving a large circulating current flowing between inductor 11 and device 12 via switches 17 and 18. The circulating current magnitude is maintained substantially constant because of the virtually zero impedance between the terminals of inductor 11.

Next, capacitor 14 is charged with current from source 21 in response to timer 22 activating switches 23 and 24 into the closed state. A current path is thereby established from one electrode of DC source 21 through switch 23 and capacitor 14 back to the other electrode of the DC source via switch 24. The charging sequences of inductor 11 and capacitor 14 are irrelevant, i.e., inductor 11 and capacitor 14 can be simultaneously charged by different sources, or inductor 11 can be charged prior to or after capacitor 14 by the same or different sources.

When it is desired to transfer the current flowing in inductor 11 from superconducting switch device 12 to load 13, timer 22 closes switch 19 and then closes switch 26. Closing switch 19 has no effect on the circulating current which continues to flow through superconducting switch device 12 because the impedance of switch device 12 is zero compared to the considerably greater impedance of load 13. In consequence, in certain instances there is no need for switch 19.

When it is desired to activate superconducting switch device 12 into the normal state from the superconducting state, timer 22 closes switch 26. In response to switch 26 being closed, current flows from capacitor 14 to superconducting switch device 12 to control the state of the device. The current supplied by capacitor 14 to device 12 quickly reaches a level sufficient to switch device 12 from the superconducting to the normal state. The current supplied by capacitor 14 to device 12 is a damped sinusoid having a relatively high first peak and a relatively short period. The current flowing from capacitor 14 to device 12 has sufficient amplitude and a high rate of change during its first quarter cycle to generate a sufficiently large magnetic field in device 12 to switch the state of the device 12. After superconducting switch device 12 has been activated into the normal state, timer 22 opens switch 18 to remove from device 12 all of the circulating current flowing out of inductor 11. Thereby, ohmic ($I^2R$) heating of superconducting switch device 12, as occurs in the normal state, is minimized and the superconducting switch device automatically returns to the superconducting state after a few cycles of the damped sinusoid from capacitor 14 have occurred. Timer 22 controls switch 18 so that the switch is preferably open during the first quarter cycle of the damped sinusoid. After the damped sinusoid has subsided, switch 26 is opened and the initial conditions of the apparatus are restored so that a new cycle can be instigated.

Figure 2:
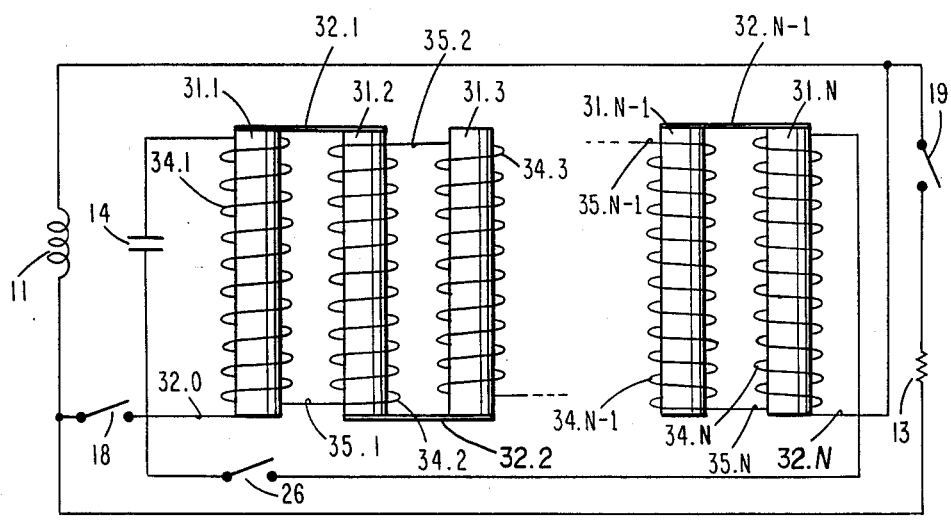
FIG. 2 is a detailed circuit diagram of the superconducting switch device illustrated in FIG. 1, in combination with a load, an energy storing inductor and a capacitor selectively connected to the superconducting switch device.

In the preferred embodiment, superconducting switch device 12 comprises plural (N) superconducting cylindrical rods 31 made of the aforementioned superconducting ceramic material. In FIG. 2, the N individual rods 31 are designated by reference numerals 31.1, 31.2, 31.3 . . . 31.N−1, 31.N. The ends of adjacent pairs of rod are electrically connected together by straps 32, so that strap 32.1 connects together adjacent ends of rods 31.1 and 31.2, strap 32.2 connects together adjacent ends of rods 31.2 and 31.3, and strap 32.N−1 connects together the ends of rods 31.N−1 and 31.N. The straps are arranged so that alternate opposite ends of rods 31 are electrically connected together. Straps 32.0 and 32.N, respectively on the ends of rods 31.1 and 31.N opposite the ends of these rods which are connected to rods 32.1 and 32.N−1, are connected to opposite terminals of inductor 11 by switch 18.

Wound on each of the superconducting, ceramic rods 31 is a separate solenoid coil 34, so that coils 34.1, 34.2, 34.3 . . . 34.N−1 and 34.N are respectively wound on rods 31.1, 31.2, 31.3 . . . 31.N−1 and 31.N. The solenoid coils are connected in series with each other by leads 35, arranged so that opposite ends of adjacent solenoidal coils on adjacent superconducting rods are interconnected. Thereby opposite ends of coils 34.1 and 34.2 are connected together by lead 35.1, opposite ends of coils 34.2 and 34.3 are connected together by lead 35.2 . . . opposite ends of coils 34.N−1 and 34.N are connected by lead 35.N. The ends of coils 34.1 and 34.N which are not connected to leads 35.N and 35.N−1 are connected to opposite electrodes of capacitor 14 via switch 26.

With current from inductor 11 flowing axially through series connected superconducting rods 31 and switch 19 closed and the superconducting rods being in the superconducting state, the shunt impedance of the superconducting rods is sufficiently low to prevent current from flowing to load 13. Under these circumstances switch 26 is closed, causing a damped sinusoidal resonant current to flow from capacitor 14 through solenoids 34. The frequency of the resonant current is determined by the capacitance of capacitor 14 and the inductance of series connected inductors 34.1, 34.2, 34.3 . . . 34.N−1 and 34.N. During the first quarter cycle of the resonant current, the amplitude and time rate of change of the current supplied to solenoid coils 34 are sufficient to drive superconducting elements 31 into the normal state from the superconducting state.

Superconducting rods 31 are driven into the normal state in response to the current flowing through solenoid coils 34. The current flowing through coils 34 induces axial magnetic fields in the superconducting rods 31. The axial magnetic fields of adjacent superconducting rods 31 are oppositely directed so that lines of magnetic flux in adjacent superconducting rods are coupled together. For example, the lines of flux in superconducting elements 31.1 and 31.2 induced by the currents flowing in coils 34.1 and 34.2 are respectively directed downwardly and upwardly in the situation illustrated in FIG. 2. Superconducting rods 31.1 and 31.2 are relatively close together so an air gap exists between the ends thereof to couple the magnetic lines of flux from rod 31.1 into rod 31.2 and vice versa.

The axial magnetic lines of flux have a rapid time rate of change in superconducting rods 31 to induce relatively large azimuthal currents in each of the superconducting structures. The azimuthal currents are basically eddy currents, having circular flow paths in cross sections at right angles to the longitudinal axes of superconducting rods 31. The azimuthal current density in superconducting rods 31 is greater than the critical current density of the superconducting rods, causing the superconducting rods to be driven out of the superconducting state into the normal state. To assure adequate current flow from capacitor 14 to solenoid coils 34 to induce sufficiently large azimuthal currents in superconducting rods 31 during the first quarter cycle of the resonant current, the capacitor is charged to a sufficiently high voltage by power supply 21 while the initial conditions are being established.

The sinusoidal current flowing from capacitor 14 through solenoid coils 34 is damped primarily by the resistance coupled to the solenoid coils by superconducting rods 31 when the rods are in the normal state. When superconducting rods 31 are in the normal state, as occurs when the current flowing in coils 34 exceeds a predetermined level during the first few cycles of the damped sinusoid, the azimuthal, eddy currents induced in rods 31 encounter appreciable resistance which is coupled back to coils 34. The resistance coupled to coils 34 from superconducting rods 31 being in the normal state materially dampens and reduces the amplitude of the sinusoidal current.

To prevent superconducting device 12 from oscillating between the normal and superconducting states and assure the continued flow of current through load 13 after device 12 has been switched to the normal state, timer 22 opens switch 18 while rods 31 are in the normal state during the first quarter cycle of the sinusoidal current flowing from capacitor 14 through coils 34. Switch 18 is open somewhat before the peak current of the sinusoid is reached during the first quarter cycle of the sinusoid. When the peak of the solenoid current is reached the magnetic field change induced by the current in coils 34 is zero causing the azimuthal current density in rods 31 to be less than the critical value, in turn causing the rods to be in the superconducting state Hence, if device 12 were connected to inductor 11 when the current in coils 34 reached a maximum at 90°, all of the current in load 13 would be shunted through device 12. This undesirable result is avoided by opening switch 18 during the first quarter cycle of the damped sinusoidal current flowing through coils 34 while superconducting rods 31 are in the normal state. By disconnecting superconducting rods 31 from inductor 11 in this manner, $I^2R$ heating of the superconducting rods 31 in response to current from inductor 11 is minimized so that the superconducting elements can be easily and quickly returned to the superconducting state, ready for the next time that current is to be switched from inductor 11 to load 13. Because switch 18 is open while superconducting elements 31 are in the normal state transients and arcs that might be associated with opening of the switch are minimized. Transients and arcs are relatively small since at this time there is a relatively small current flowing from inductor 11 through the high impedance of the superconducting rods 31.

A preferred mechanical arrangement for the construction of superconducting switch device 12 is schematically illustrated in FIGS. 3 and 4. As illustrated in FIG. 4 sixteen superconducting cylinders 31.1–31.16 are arranged in a 4×4 matrix with parallel longitudinal axes in cubic housing 41; each side of the housing has a length L.

Opposite ends of alternate adjacent pairs of superconducting rods 31 are connected together by metal, preferably copper, straps 32 in each row and the outer columns of the matrix. Opposite ends of alternate pairs of superconducting rods 31 in each matrix row are connected together. Thus, for example, in the top matrix row including superconducting rods 31.1–31.4, the first ends of superconducting rods 31.1 and 31.2 are connected together by metal strap 32.1, the second, opposite ends of superconducting rods 31.2 and 31.3 are connected together by metal strap 32.2, the first ends of superconducting rods 31.3 and 31.4 are connected together by strap 32.3. Similar connections are respectively provided by straps 32.5–32.7, 32.9–32.11 and 32.13–32.15 in the second, third and bottom rows between superconducting rods 31.5–31.8, 31.9–31.12 and 31.13–31.16. In the extreme left column the second ends of superconducting rods 31.8 and 31.9 are connected together by metal strap 32.8. In the extreme right column of the matrix, the second ends of superconducting rods 31.4 and 31.5 are connected together by metal strap 32.4, while the second ends of superconducting rods 31.12 and 31.13 are connected together by metal strap 32.12. The stated connections cause the current which is applied to the superconducting elements by inductor 11 to flow in adjacent pairs of superconducting rods 31 in opposite directions, as indicated by arrows 43. The current flowing through adjacent superconducting rods is oppositely directed for pairs of the superconducting rods adjacent each other in the horizontal and vertical directions.

As illustrated in FIG. 3, solenoid coils 34 are wound on superconducting rods 31 so that the axial magnetic fluxes induced in the superconductors by the current flowing through the solenoid coils during the first quarter cycle of the damped sinusoid are directed in the same direction as the current flowing in the superconductors from inductor 11. Thereby, the magnetic lines of flux induced in superconducting rods 31 by the current flowing through solenoid coils 34 in adjacent superconducting rods are coupled together, to minimize the reluctance of the magnetic circuit associated with each solenoid coil.

Cubic housing 41 includes, on opposite faces thereof which are parallel to the axes of rods 31, ports 44 and 45, respectively connected to conduits 46 and 47. Conduits 46 and 47 are respectively connected to a liquid nitrogen source and a liquid nitrogen sump to maintain superconductor rods 31 enclosed in housing 41 at approximately liquid nitrogen temperatures. Superconducting rods 31, being ceramic superconductors, are in the superconducting state when they are at temperatures as great as 20°–30° K. above the 77° K. temperature of liquid nitrogen The spaces between the 4×4 matrix of superconducting rods 31 form channels having low flow impedance to the liquid nitrogen flowing into and out of housing 41 via ports 44 and 45. The liquid nitrogen circulating around all surfaces of superconducting rods 31 maintains the rods at temperatures of approximately 77° K. The liquid nitrogen flow paths around rods 31 are enhanced by locating ports 44 and 45 on walls of housing 41 at right angles to the plane containing straps 32.

To prevent short circuiting of solenoid coils 34, superconductor rods 31 are coated with dielectric cladding 48 and the solenoid coils are covered with insulating coating 49. The end faces of superconducting elements 31 connected to metal straps 32 are not coated with the dielectric cladding, so that the metal, preferably copper, straps can be electrically and mechanically connected to the superconducting elements in a facile manner.

The stated 4×4 geometry of rods 31 and straps 32 provides a very low inductance current path from one terminal of inductor 11 through the series connected rods to the other terminal of the inductor; the inductance of the current path between inductor 11 and rods 31 is so low it can be interrupted with virtually no arc. The inductance of the main current path through rods 31 can be reduced further by surrounding the rods with copper tubes that form coaxial return current paths back to inductor 11; the return current paths are insulated from rods 31. The copper tubes form shields similiar to the shields of a co-axial cable to magnetically decouple the magnetic fields associated with the currents flowing through the rods from each other. The interiors of the copper tubes are provided with an insulating coating and bear against solenoidal coils 34 so that superconducting rods 31 and the copper tubes are insulated from each other and from the solenoidal coils.

To analyze the device illustrated in FIGS. 1–4, the 16 superconducting rods 31.1–31.16 compactly packaged in the low inductance series stack illustrated in FIG. 4 are assumed to have identical geometry, as well as material, and two resistance states, namely $$R = 0 \text{ (superconducting state)}$$

$$R_N = \frac{dr_N}{A} \text{ (normal state)}$$

where $R_N$ is the resistance of the series connected superconducting elements 31.1–31.16, d is the total length of all 16 superconducting elements, $r_N$ is the resistivity of the superconducting material in the normal state, and A is the cross-sectional area of the superconducting cylindrical rods;

typically, $r_N$ is several orders of magnitude greater than the resistivity of normal copper. With superconducting rods 31 cooled to a temperature below the critical temperature, $T_c$, required for superconductivity, energy storing inductor 11 is charged to a current I less than $Aj_c$, where $j_c$ is the superconductor critical current density at $T_c$. The circuit is then activated when it is desired to feed load 13 by connecting capacitor 14 so it drives current through solenoid windings 34. Superconducting rods 31 then switch to a normal resistive state, producing a resistance having a magnitude much greater than the load resistance $R_L$, i.e., $R_N$ is at least five times greater than $R_L$. Thereby, a large fraction $$\frac{R_N}{R_N + R_L}$$

(at least 80%) of the large inductor current I is rapidly commutated into load 13. A residual current $$\frac{IR_L}{R_N + R_L}$$

flows in superconducting rods 31. While the residual current (<0.21) flows in superconducting device 12, switch 18 disconnects the superconducting device from the remainder of the circuit. The time available to open switch 18 against the residual current in superconducting switch device 12 is also determined by the circuit parameters of the circuit including capacitor 14 and windings 34 utilized to trigger or switch elements 31 between the superconducting and normal states. An analysis of the trigger circuit is made assuming that capacitor 14 has a capacitance C and that the solenoid windings 34.1–34.16 have n turns per unit length, whereby the solenoid has an inductance $$L = \frac{4\pi n^2 Ad}{c^2}$$

where c equals the speed of light.

In response to switch 26 being closed, the current density $j_\phi$ induced in superconducting rods 31 is greater an the critical current density $j_c$ required to switch the superconducting rods into the normal state. The time required for the azmuthal current density to exceed the critical current density is short compared to a quarter cycle of the damped sinusoidal current; the interval required for the damped sinusoidal current to reach its first maximum, i.e., the duration of the first quarter cycle of the damp sinusoid, is $$\tau = \frac{\pi \sqrt{LC}}{2}$$

The azimuthal current diffuses rapidly into superconducting rods 31 in a short time compared to $\tau$. The ohmic dissipation of the azimuthal current is small during $\tau$. The azimuthal electric field, E, at radial position r in each cylindrical superconducting rods 31 is $$E = -\frac{rB}{2c}$$

where B is the time rate of change of the magnetic field induced in the superconducting elements by the axial field in the superconducting elements resulting from the current flowing through solenoid windings 34.

The azimuthal current density is $$j_\phi = -\frac{rB}{2cr_N}$$

where $\beta = \frac{4\pi n}{c} I_{sol}$ $$I_{sol} = I_m \sin\left(\frac{t}{\sqrt{LC}}\right)$$

$I_{sol}$ is the instanteous current flowing in solenoid windings 34, $I_M$ is the maximum amplitude of current $I_{sol}$, t=time Hence $I_{sol}$ basically represents the current variation during the first quarter cycle of the damped sinusoidal current flowing between capacitor 14 and windings 34. The maximum solenoid current $I_m$ can be expressed in terms of the maximum azimuthal current density $j_\phi$. The azimuthal current density is maximum at the outer edges of superconducting rods 31 when switch 26 is initially closed and as current begins to flow from capacitor 14 to superconducting elements 31. It can be shown that the maximum current in windings 34 can be represented as:

$$I_M = \frac{r_N c^2 (LC)^{\frac{1}{2}} j_c}{2\pi n a} \left(\frac{j_\phi}{j_c}\right)$$

where a=the radius of rods 31 and n=the number of turns per unit length of windings 34 on rods 31.

The circuit including capacitor 14 and solenoid windings 34 for triggering superconducting elements 31 from the superconducting state to the normal state must have values of C, L and n selected to enable the value of $I_m$ to be sufficiently large to cause the value of $j_\phi$ to exceed the value of $j_c$. Also, proper selection of the values of C, L and n enables the time required to switch the current stored in inductor 11 from superconducting switch device 12 to load 13 to be minimized to the desired duration. It can be shown that the values of C, L and n should be selected approximately in accordance with:

$$C = \frac{10^{-7} A l B_m^2}{4\pi V^2} \quad \text{(farads)}$$

$$L = \frac{\pi^2 \tau^2}{2C} \quad \text{(henries)}$$

$$n = \frac{5 B_M}{2\pi I_M} \quad \text{(turns/cm)}$$

where $B_M = \frac{4 \cdot 10^8 r_N \tau j_c}{(\pi A)^{\frac{1}{2}}} \left(\frac{j_\phi}{j_c}\right)$ (gauss) and V=the initial voltage in volts across capacitor 14. These values for C, L and n cause the maximum current of the sinusoid to be $$I_M = V \left(\frac{C}{L}\right)^{\frac{1}{2}} \text{ amperes.}$$

In the foregoing, it is assumed that each of solenoid windings 34 has approximately the same exterior dimensions as each of superconducting rods 31 so that the total length of rods 31 is d and the area circumscribed by one winding turn of winding 34 is $A=\pi a^2$. Typically, the ratio $j_\phi/j_c=2$, to convert superconducting rods 31 quickly from the superconducting state to the normal state.

Proper design of the system involves consideration of the physical size of housing 41 for superconducting rods 31, the total energy stored in capacitor 14 and the temperature increase resulting from dissipation of the azimuthal currents in rods 31 as well as the diffusion time of magnetic flux into the rods and the ohmic power of the azimuthal currents dissipated in the rods.

To determine the physical size of cubic housing for superconducting rods 31.1–31.16, it can be validly assumed that 25% of the housing volume is occupied by channels for the liquid nitrogen coolant for the liquid nitrogen plus electrical insulating material and that 75% of the housing volume is occupied by superconducting rods 31.1–31.16. Under these conditions, it can be shown that the volume of housing 41 is:

$$L_{Box}^3 = \left[1.33 \left(\frac{R_N}{R_L}\right)\left(\frac{R_L}{r_N}\right)\right] A^2$$

which is proportional to $$\frac{1}{r_N j_c^2}$$

where A is equal to or greater than $1/j_c$ and useful values for $R_N/R_L$ are typically five or more.

It can be shown that the energy stored in trigger pulse capacitor 14 required to switch superconducting elements 31 from the superconducting to the normal state is $$W_{Trigr} = \cdot A d \frac{B_M^2}{8\pi} = \left(\frac{3}{4}\right)\left(\frac{B_m^2}{8\pi}\right) L_{box}^3$$

The temperature increase of superconducting rods 31 due to the energy transferred from capacitor 14 to the superconductor is $$\Delta T = \frac{1}{\rho c_v} \left(\frac{B_m^2}{8\pi}\right)$$

where $c_v$ is the specific heat of superconducting elements 31 at the temperature of these elements prior to the superconducting elements being activated into the normal state, and $\sigma$ is the mass density of elements 31.

The time, $\tau_{diffuse}$, required for the azimuthal currents to diffuse into superconducting elements 31 to an extent necessary to exceed the critical current density required to switch superconducting rods 31 from the superconducting to the normal state can be validly assumed to be the same as for a cylinder with normal resistivity $r_N$, whereby $$\tau_{diffuse} = \frac{4 \cdot 10^{-9}(A)}{r_N}$$

To satisfy the previously stated relationship for the azimuthal current density $j_\phi$, being equal to $$-\frac{r}{2c \, r_N} B$$

it is necessary for $$\tau = \frac{\pi}{2} \sqrt{LC}$$

to equal or exceed $\tau_{diffuse}$. The time and spatial average ohmic power dissipated in rods 31 in response to the induced azimuthal, eddy current can be shown to be $$dA < \frac{j_\phi^2}{r_N}>,$$

where $<>$ means both a radial space average and a time average.

The average ohmic power dissipated in rods 31 in response to the induced currents can therefore be represented as $$P_{N,ohmic} = \frac{10^{-18} \pi^3 \, dA^2 n^2 \, I_M^2}{4 \, r_N \tau^2} \text{ watts}$$

If the energy dissipated by the azimuthal currents in the superconducting elements 31, is less than the energy stored in capacitor 14, $W_{Trigr}$ several damped sinusoidal oscillations occur in the circuit including capacitor 14 and solenoid winding 34 in response to closure of switch 26.

A given application will generally determine I, $\tau$, $R_L$ and $R_N$. For fixed values of these parameters, the length of each side of housing 41 and the energy stored in capacitor 41 are proportional to $$L_{box} \alpha r_N^{-\frac{1}{2}} j_c^{-\frac{1}{2}}$$

$$W_{Trigr} \alpha r_N j_c^{\alpha 2}$$

From these two relationships, the most useful superconducting materials for rods 31 have a high normal resistivity and large critical current density.

While there have been described and illustrated several specific embodiments of the invention, it will be clear that variations in the details of the embodiments specifically illustrated and described may be made without departing from the true spirit and scope of the invention as defined in the appended claims.

What is claimed is:

1. Apparatus for selectively supplying current to a load comprising an energy storing inductor, a superconducting device connected in shunt with the inductor, the superconducting device when in a normal state having an impedance much greater than that of the load and when in a superconducting state having an impedance much less than that of the load so that a circulating current from the inductor flows through the device while it is in a superconducting state, the device being switchable between the superconducting and normal states in response to a magnetic field applied to a superconducting structure of the device being above and below predetermined values thereof, means for connecting the load to the inductor so that when the device is in the normal state circulating current in the inductor is switched to flow from the device through the load, and means for selectively applying a magnetic field to the structure so the magnetic field applied to the structure is selectively above and below the predetermined value and thereby switch the device between the superconducting and normal states.

2. The apparatus of claim 1 wherein the means for applying the magnetic fields includes solenoid means on the structure for inducing an axial magnetic field in the structure in response to current from a source, the axial magnetic field inducing an azimuthal current in the structure, the azimuthal current having sufficient density in the structure to change the state of the device from the superconducting state to the normal state.

3. The apparatus of claim 2 wherein the solenoid means includes inductance and the source includes a capacitor, the capacitor and inductance having values and being connected with each other so that a damped sinusoidal current flows in the solenoid, the damped sinusoidal current having a maximum value during the first quarter cycle thereof to cause the azimuthal current induced in the structure to have a density causing the magnetic field to exceed the critical value so that the state of the device changes from the superconducting state to the normal state during the first quarter cycle of the damped sinusoidal current.

4. The apparatus of claim 3 further including a switch connected in series with the energy storing inductor and superconducting device, and means for changing the state of the switch from the closed to the open state while the device is in the normal state during the first quarter cycle.

5. The apparatus of claim 3 further comprising a switch connected in series with the energy storing inductor and load so that when the switch is closed current flowing from the inductor to the load flows through the switch but does not flow through the device, and means for changing the state of the switch from the open to the closed state immediately prior to the device being switched from the superconducting to the normal state.

6. The apparatus of claim 3 further including a first switch connected in series with the inductor and superconducting device means for changing the state of the first switch from the closed to the open state while the device is in the normal state during the first quarter cycle, a second switch connected in series with the inductor and load so that when the second switch is closed current flowing from the inductor to the load flows through the second switch but does not flow through the device, and means for changing the state of the second switch from the open to the closed state immediately prior to the device being switched from the superconducting to the normal state.

7. The apparatus of claim 2 wherein the device comprises plural elongated superconducting structures having parallel axes, the structure being arranged so adjacent ends thereof are electrically connected with each other so that the circulating current flows axially in opposite directions through adjacent ones of said structures, the solenoid means including a solenoid coil wound on each of the structures.

8. The apparatus of claim 7 wherein the structures are arranged in plural rows and plural columns.

9. The apparatus of claim 7 further including a housing in which the structures are located, and means for supplying a cooling fluid to the housing for maintaining the structures at a temperature substantially below the temperature needed to maintain the structures in the superconducting state.

10. The apparatus of claim 9 wherein the structures are located in the housing so that channels subsist between them, the channels being arranged so that a flow path for the cooling fluid subsists between the structures.

11. The apparatus of claim 1 wherein the superconducting structure is a ceramic.

12. The apparatus of claim 1 wherein the means for applying the magnetic field includes means for applying a magnetic field that changes as a function of time, the magnitude of the rate of change of the magnetic field controlling switching of the superconducting structure from the superconducting state to the normal state.

13. A method of selectively supplying current to a load from a charged energy storing inductor connected to a superconducting device shunting the load, the superconducting device when in a normal state having an impedance much greater than that of the load and when in a superconducting state having an impedance much less than that of the load, the device being switchable between the superconducting and normal states in response to a magnetic field applied to a superconducting structure of the device being above and below predetermined values thereof, comprising the steps of maintaining the device in a superconducting state so that circulating current from the inductor flows through the device, and then changing the state of the device from the superconducting state to the normal state while the load is connected to the inductor by applying a magnetic field to the structure so the magnetic field applied to the structure is selectively above and below the predetermined value so that current from the inductor is switched to flow from the device through the load.

14. The method of claim 13 wherein the magnetic field is applied by inducing an axial magnetic field in the structure in response to current from a source, the axial magnetic field inducing an azimuthal current in the structure, the azimuthal current having sufficient density in the structure to change the state of the device from the superconducting state to the normal state.

15. The method of claim 14 wherein the magnetic field is derived by applying current to a solenoid wound on the structure.

16. The method of claim 15 wherein the current applied to the solenoid has a damped sinusoidal waveform having a maximum value during the first quarter cycle thereof to cause the azimuthal current induced in the structure to have a density exceeding the critical value so that the state of the device changes from the superconducting state to the normal state during the first quarter cycle of the camped sinusoidal current.

17. The method of claim 13 wherein the superconducting structure is switched between the superconducting state and the normal state in response to a time-varying magnetic field, the magnitude of the rate of change of the magnetic field controlling switching of the superconducting structure from the superconducting state to the normal state.

18. A superconducting device switchably controlled between a superconducting state and a normal state comprising a superconductor structure having a superconducting material with a resistivity several orders of magnitude greater than that of copper, said structure adapted to be connected to a first source so current from the first source flows longitudinally through the superconducting material, and means for inducing a longitudinal magnetic field in the superconducting material, the longitudinal current and magnetic field being aligned, the magnetic field inducing eddy currents in the superconducting material, the eddy currents having sufficient density in the superconducting material to change the state of the superconducting material from the superconducting state to the normal state.

19. The device of claim 18 wherein the structure is elongated and has a longitudinal axis and includes connections so that the current from the first source flows through the structure in the direction of the longitudinal axis, the magnetic field inducing means including a solenoid coil wound on the elongated structure so that the magnetic field extends through the structure in the direction of the longitudinal axis, the magnetic field inducing azimuthal eddy currents in the structure.

20. The device of claim 19 wherein the device comprises plural elongated superconducting structures having parallel axes, the structures being arranged so adjacent ends thereof are electrically connected to each other so that current flows longitudinally along the axes in opposite directions through adjacent ones of said structures, the solenoid means including a solenoid coil wound o each of the structures.

21. The device of claim 20 wherein the structures are arranged in a matrix including plural rows and plural columns arranged at right angles to the axes.

22. The device of claim 21 further including a housing, the structures being located in the housing, and means for supplying a cooling fluid to the housing for maintaining the structures at a temperature substantially below the temperature needed to maintain the structures in the superconducting state.

23. The device of claim 22 wherein the structures are located in the housing so channels subsist between them, the channels being arranged so a flow path for the cooling fluid subsists between the structures.

24. A method of selectively supplying current to a load from a charged energy storing inductor connected to a ceramic superconducting device shunting the load, the superconducting device when in a normal state having an impedance much greater than that of the load and when in a superconducting state having an impedance much less than that of the load, the device being switchable between the superconducting and normal states in response to a magnetic field applied to a ceramic superconducting structure of the device being above and below predetermined values thereof, comprising the steps of maintaining the device in a superconducting state so that circulating current from the inductor flows through the device, and then changing the state of the device from the superconducting state to the normal state while the load is connected to the inductor by applying a magnetic field to the structure so the magnetic field applied to the structure is selectively above and below the predetermined value so that current from the inductor is switched to flow from the device through the load.

25. In combination, plural elongated superconducting structures having parallel axes, the structures being arranged so adjacent ends of adjacent structures are electrically connected to each other, one respective end of each of two different ones of said structures being connected to a respective terminal, the connections of the ends of the structures to each other and to the terminals being such that in response to the terminals being connected to a current source current from the source flows axially in opposite directions through adjacent ones of said structures, a solenoid coil wound on each of the structures so that in response to sufficient current being supplied to each of the coils the structure on which a particular coil is wound changes state from a superconducting to a normal state, each of the structures when in the normal state having a resistivity at least several orders of magnitude greater than that of copper, adjacent ones of the structures being magnetically coupled together.

26. The combination of claim 25, wherein the structures are arranged in a matrix of plural rows and columns.

27. The combination of claim 25 further including a housing in which the structures are located, and means for supplying a cooling fluid to the housing for maintaining the structures at a temperature substantially below the temperature needed to maintain the structures in the superconducting state.

28. The combination of claim 27 wherein the structures are located in the housing so that channels subsist between them, the channels being arranged so that a flow path for the cooling fluid subsists between the structures.

29. A method of switching a superconducting structure from a superconducting state to a normal state, the superconductor structure having a resistivity in the normal state several orders of magnitude greater than that of copper, the method comprising inducing eddy currents in the superconducting structure, the eddy currents having sufficient density in the superconducting structure to change the state of the superconducting structure from the superconducting state to the normal state, supplying load current to the structure while the structure is changing state, the superconducting structure thereby being switched from a low impedance to a high impedance for the load current supplied to it.

30. The method of claim 29 wherein the eddy currents are induced in the structure by inducing a magnetic field in the structure.

31. The method of claim 30 wherein the supplied load current flows in a predetermined direction through the structure, the eddy currents flowing in planes generally at right angles to the predetermined direction.

32. A method of switching a superconducting structure from a superconducting state to a normal state, the superconductor structure having a resistivity several orders of magnitude greater than that of copper, the method comprising inducing a magnetic field in the structure, the magnetic field having a rate of change with a value sufficient to change the state of the superconducting material from the superconducting state to the normal state independently of the magnitude of the induced magnetic field, supplying load current to the structure while the magnetic field rate of change has a value sufficient to change the state of the superconducting material from the superconducting state to the normal state, the superconducting structure thereby being switched from a low impedance to a high impedance for the load current supplied to it.

33. The method of claim 32 wherein the magnetic field is induced in the structure in response to eddy currents induced in the structure.

34. The method of claim 33 wherein the eddy currents are induced in the structure by inducing a magnetic field in the structure.

35. The method of claim 34 wherein the supplied load current flows in a predetermined direction in the structure, the load current and magnetic field in the structure being generally aligned.

36. The method of claim 34 wherein the supplied load current flows in a predetermined direction in the structure, the load current and eddy currents being generally in planes at right angles to each other.

* * * * *